United States Patent
Li et al.

(10) Patent No.: US 10,241,371 B2
(45) Date of Patent: Mar. 26, 2019

(54) THIN FILM TRANSISTOR, METHOD FOR MANUFACTURING THE SAME, ARRAY SUBSTRATE AND DISPLAY DEVICE

(71) Applicants: BOE TECHNOLOGY GROUP CO., LTD., Beijing (CN); Hefei BOE Optoelectronics Technology Co., Ltd., Anhui (CN)

(72) Inventors: Hefei Li, Beijing (CN); Xianxue Duan, Beijing (CN); Chengcheng Wang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/811,835

(22) Filed: Nov. 14, 2017

(65) Prior Publication Data

US 2018/0299736 A1 Oct. 18, 2018

(30) Foreign Application Priority Data

Apr. 18, 2017 (CN) .......................... 2017 1 0254487

(51) Int. Cl.
*H01L 27/12* (2006.01)
*G02F 1/1362* (2006.01)
*G02F 1/1368* (2006.01)

(52) U.S. Cl.
CPC ...... *G02F 1/136209* (2013.01); *G02F 1/1368* (2013.01); *G02F 1/136286* (2013.01); *H01L 27/1214* (2013.01); *G02F 2201/123* (2013.01)

(58) Field of Classification Search
CPC combination set(s) only.
See application file for complete search history.

(56) References Cited

U.S. PATENT DOCUMENTS

| | | | | |
|---|---|---|---|---|
| 2007/0117237 A1* | 5/2007 | Inoue | .................... | C23C 14/086 438/30 |
| 2012/0073866 A1* | 3/2012 | Hirai | .................... | G06F 3/044 174/257 |
| 2014/0284590 A1* | 9/2014 | Nakazawa | ............. | G02B 5/201 257/40 |
| 2015/0303222 A1* | 10/2015 | Ning | .................... | G02F 1/1368 257/43 |
| 2017/0200600 A1* | 7/2017 | He | .................... | H01L 21/0242 |
| 2018/0082856 A1* | 3/2018 | Liu | .................... | H01L 21/02631 |
| 2018/0145094 A1* | 5/2018 | Yan | .................... | H01L 29/78696 |

* cited by examiner

*Primary Examiner* — Mamadou Diallo
(74) *Attorney, Agent, or Firm* — Calfee, Halter & Griswold LLP

(57) ABSTRACT

A thin film transistor, a method for manufacturing the same, an array substrate and a display device are provided. The method for manufacturing a thin film transistor includes: providing a substrate; forming an active layer and a light shielding layer covering the active layer on the substrate by a patterning process, the light shielding layer being formed of a photoresist material; and forming a source-drain electrode layer and a passivation layer covering the source-drain electrode layer.

18 Claims, 2 Drawing Sheets

THIN FILM TRANSISTOR, METHOD FOR MANUFACTURING THE SAME, ARRAY SUBSTRATE AND DISPLAY DEVICE

CROSS-REFERENCES TO RELATED APPLICATIONS

This application claims priority to Chinese Patent Application No. 201710254487.X, titled "A thin film transistor, a method for manufacturing the same, an array substrate and a display device", and filed on Apr. 18, 2017, the entire contents of which are hereby incorporated by reference.

TECHNICAL FIELD

The present disclosure relates to the field of display apparatus technology, and more particularly, to a thin film transistor, a method for manufacturing the same, an array substrate and a display device.

BACKGROUND

A TFT-LCD (Thin Film Transistor Liquid Crystal Display) has been developed rapidly in recent years due to its advantages such as low power consumption, lightness and thinness, ease of use, high brightness, high contrast and high response speed, which occupies a leading position in a current flat panel display market. Meanwhile, in order to meet market demands, the TFT-LCD is developing towards high resolution, lightness and thinness, low power consumption and high quality. The display screen uniformity, high resolution, no interaction or the like are key requirements of a high quality TFT-LCD. A magnitude of a leakage current (Ioff) is one of important parameters affecting performance of an LCD screen. Too high leakage current will affect switching features of the TFT, resulting in display uneven, whitening, interaction and other display defects of the TFT-LCD. However, an active layer is quite sensitive to light, that is, even if the active layer is subject to irradiation of weak light, a quite large leakage current will generate in the active layer. With the increase of light intensity and extension of irradiating time, characteristics of the TFT device will sharply decline, resulting in deterioration of the display quality.

SUMMARY

An objective of the present disclosure is to provide a thin film transistor, a method for manufacturing the same, an array substrate and a display device.

An embodiment of the present disclosure provides a method for manufacturing a thin film transistor, including: providing a substrate; forming an active layer and a light shielding layer covering the active layer on the substrate by a patterning process, the light shielding layer being formed of a photoresist material; and forming a source-drain electrode layer and a passivation layer covering the source-drain electrode layer.

In an implementation, the forming an active layer and a light shielding layer covering the active layer on the substrate by a patterning process includes: depositing the active layer on the substrate; coating a photoresist layer on the active layer; and etching the active layer by using the photoresist layer as a mask, to obtain an active layer and the light shielding layer covering the active layer.

In an implementation, the etching the active layer by using the photoresist layer as a mask, to obtain an active layer and the light shielding layer covering the active layer includes: exposing the photoresist layer by using a mask plate, such that the photoresist layer forms an unexposed region, a partially exposed region and a fully exposed region; performing developing treatment to the photoresist layer, such that the photoresist layer forms a completely reserved region corresponding to the unexposed region, a partially reserved region corresponding to the partially exposed region and a completely removed region corresponding to the fully exposed region; etching the active layer corresponding to the fully exposed region by using an etching process; and performing ashing treatment to the photoresist, such that the completely reserved region of the photoresist layer forms the light shielding layer.

In an implementation, the photoresist material is a material having a photosensitive property, and a thickness of the light shielding layer is 400 nm.

An embodiment of the present disclosure further provides a thin film transistor, including: a substrate; an active layer, formed above the substrate; and a light shielding layer, formed above the active layer, the light shielding layer covering the active layer, wherein the light shielding layer is composed of a photoresist material.

In an implementation, the active layer and the light shielding layer are formed by a patterning process, and the light shielding layer is served as a mask for forming the active layer.

In an implementation, the thin film transistor further includes: a gate line, formed above the substrate; an insulating layer, formed above the gate line, wherein the active layer is formed above the insulating layer; a source-drain electrode layer and a passivation layer, formed above the light shielding layer; and a pixel electrode layer, formed above a region of the substrate away from the gate line.

In an implementation, the photoresist material is a material having a photosensitive property, and a thickness of the light shielding layer is 400 nm.

The present disclosure further provides an array substrate, including the thin film transistor described above.

The present disclosure further provides a display device, including the array substrate described above.

DETAILED DESCRIPTION

The present disclosure will now be described in further detail with reference to the accompanying drawings and embodiments. It is to be understood that the specific embodiments described herein are merely for the purpose of explaining the present disclosure but not to be limiting the present disclosure. Besides, it is to be noted that, for the sake of convenience of description, only parts related to the present disclosure but not all structures are shown in the accompanying drawings.

In the related art, the liquid crystal panel is composed of an array substrate, a color film substrate and a liquid crystal layer. A part of light from a backlight source will be reflected to the active layer through the color film substrate or the liquid crystal layer, resulting in increased leakage current and affecting the display quality.

The present embodiment provides a method for manufacturing a thin film transistor. FIGS. 1 to 7 show process diagrams of manufacturing a thin film transistor according to the present embodiment.

The method for manufacturing a thin film transistor according to the present embodiment includes following steps.

In step 1, a glass substrate 1 is provided and cleaned.

Figure 1:
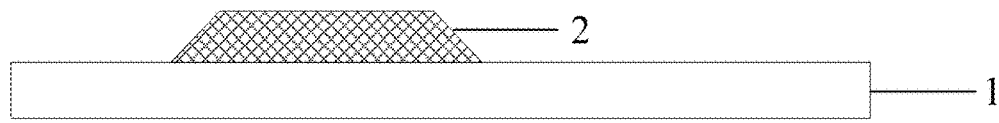
FIGS. 1 to 7 show process diagrams of manufacturing a thin film transistor according to embodiments.

In step 2, a gate line 2 is manufactured on the glass substrate 1 by deposition, exposure, developing, etching and other processes, as shown in FIG. 1.

Figure 2:
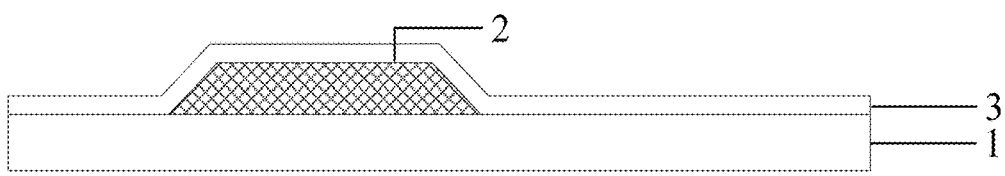

In step 3, an insulating layer 3 is deposited on the glass substrate 1 by PECVD (Plasma Enhanced Chemical Vapor Deposition), as shown in FIG. 2.

In step 4, an active layer and a light shielding layer covering the active layer are manufactured by a patterning process. Specifically, a photoresist layer is coated on the active layer, the active layer is etched by using the photoresist layer as a mask, to obtain an active layer and at the same time a portion reserved by the photoresist layer is served as the light shielding layer covering the active layer.

The specific procedure described in step 4 is described in details below.

Figure 3:
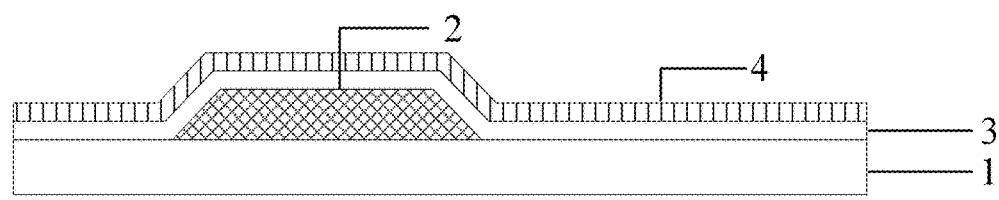

1): The active layer 4 is deposited on the substrate by PECVD, as shown in FIG. 3.

2) The passivation layer is coated with a black light shielding layer 5, and the light shielding layer is a material having a photosensitive property. In an embodiment, the light shielding layer is a positive photoresist material or a negative photoresist.

Figure 4:
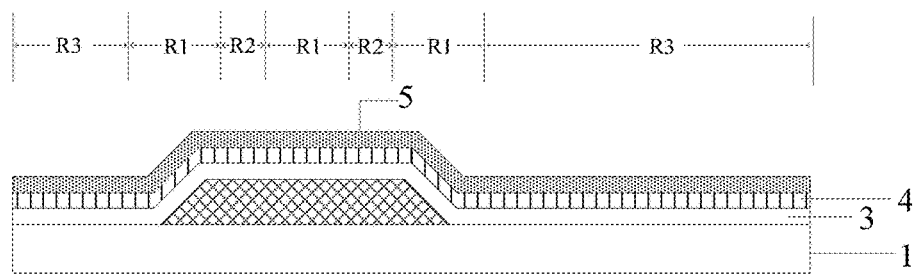

3): The light shielding layer 5 on the substrate is designed to be a region where a final light shielding layer is to be formed and a region where the source and drain electrodes are to be successively formed. The glass substrate is exposed by a mask plate of halftone or gray tone, such that the photoresist forms an unexposed region R1 corresponding to the region of the final light shielding layer, a partially exposed region R2 corresponding to a region where the source and drain electrodes are to be successively formed, and a fully exposed region R3 where the light shielding layer will be completely removed subsequently. The formed structure is shown in FIG. 4. That is, the fully exposed region R3 corresponds to a region where patterns except for a silicon island (i.e., an active region on the thin film transistor) are located. The partially exposed region R2 corresponds to the region where the source and drain electrodes are to be successively formed. The unexposed region R1 corresponds to a region beyond the above pattern regions, and the photoresist in this region will be reserved to form the final light shielding layer.

Figure 5:
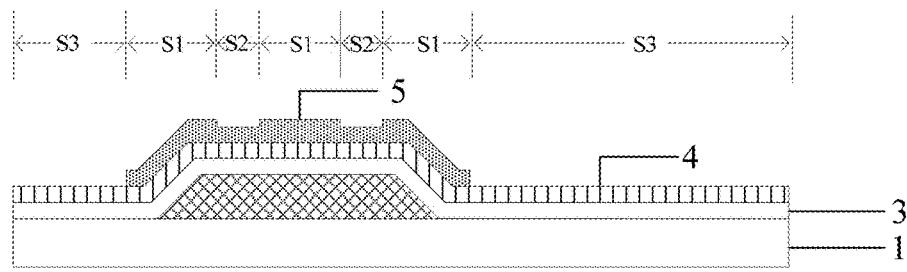

4): The photoresist is subjected to developing treatment. After the developing treatment is performed, a thickness of the photoresist in the unexposed region does not change, and a region S1 where the photoresist is completely reserved (corresponding to the above region R1) is formed. A thickness of the photoresist in the partially exposed region becomes thinner, and a photoresist partially reserved region S2 (corresponding to the above region R2) is formed. The photoresist in the completely exposed region is completely removed, and a photoresist completely removed region S3 (corresponding to the above region R3) is formed. The formed structure is shown in FIG. 5.

Figure 6:
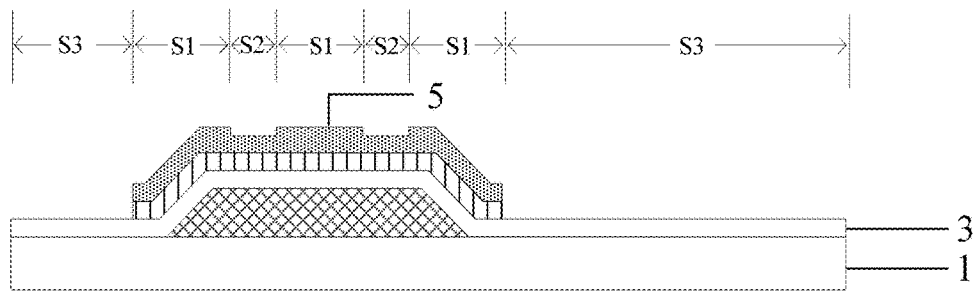

5): The active layer corresponding to photoresist completely removed region S3 is completely etched by the first etching process, and the formed structure is shown in FIG. 6.

Figure 7:
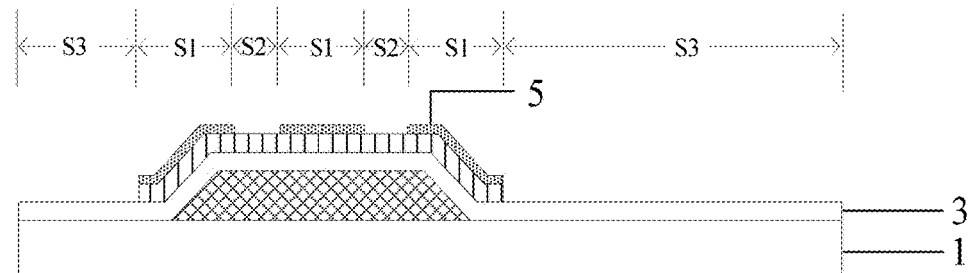

6): The photoresist of the partially reserved region S2 is removed by the process of ashing, such that the photoresist of the photoresist partially reserved region S2 is completely removed, and the thickness of the photoresist in the photoresist completely reserved region becomes thinner. After the process of ashing is completed, no stripping process is required, and the reserved photoresist forms the desired light shielding layer 5, as shown in FIG. 7. The thickness of the finally formed light shielding layer 5 is 400 nm, the light shielding layer with this thickness may be more effective in reducing the leakage current generated when the active layer is exposed to light, and the display quality can be improved.

In step 5, a source-drain electrode layer 6, a passivation layer 7 and a pixel electrode 8 are successively fabricated by the processes of deposition, exposure, developing, etching successively performed and other processes. The manufacturing of the thin film transistor is completed, to obtain a structure of the thin film transistor as shown in FIG. 8.

In the present embodiment, a light shielding layer is manufactured above an active layer to reduce a leakage current generated by irradiating the active layer with light and enhance the display quality. Besides, the light shielding layer is of a photoresist material, a photoresist layer is adopted as a mask in a process of preparing the active layer. After the preparation of the active layer is completed, the reserved photoresist layer may be used as the light shielding layer covering the active layer. The shielding layer and the active layer are manufactured through by one time of a patterning process, which eliminates the need to add patterning processes, simplifies the technological process, and improves production efficiency.

The embodiment of the present disclosure provides a thin film transistor. FIG. 8 shows a schematic structural view of a thin film transistor according to an embodiment.

Figure 8:
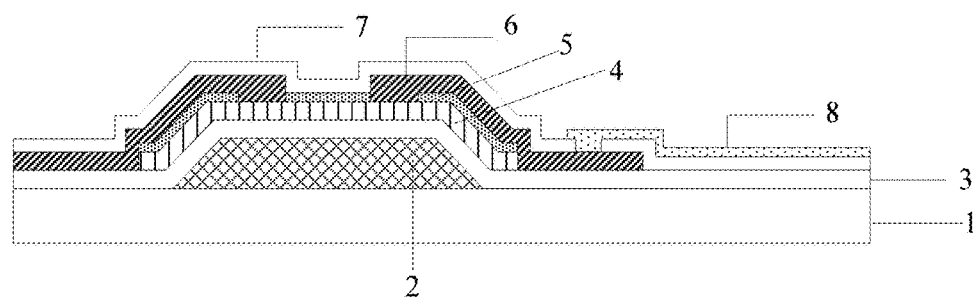
FIG. 8 shows a schematic structural diagram of a thin film transistor according to an embodiment.

As shown in FIG. 8, the thin film transistor according to the present embodiment includes: a substrate 1; an active layer 4, formed on the substrate 1; and a light shielding layer 5, formed on the active layer away from the substrate 1, the light shielding layer 5 covering the active layer 4 and a thickness of the light shielding layer 5 being 400 nm. In the embodiment, the light shielding layer is composed of a photoresist material. By covering the active layer 4 with the light shielding layer 5 composed of the photoresist material, it is possible to reduce the leakage current generated when the active layer is exposed to light and improve display quality.

In the process of forming the active layer 4, the photoresist layer is adopted as a mask layer, and after the formation of the active layer is completed, the reserved photoresist layer is served as the light shielding layer 5 to cover the active layer 4. In this way, the light shielding layer is formed by a patterning process, which simplifies the technological process.

The thin film transistor according to the present embodiment further includes: a gate line 2, formed on the substrate 1; an insulating layer 3, formed on the gate line 2 away from the substrate 1, wherein the active layer 4 is formed on the insulating layer 3 away from the substrate 1; a source-drain electrode layer 6 and a passivation layer 7, formed above the light shielding layer 5; and a pixel electrode layer 8, formed above a region of the substrate away from the gate line 2.

In an implementation, the thin film transistor according to the present embodiment may be prepared by the method for manufacturing a thin film transistor in the above described embodiment.

In the thin film transistor of the present embodiment, a light shielding layer is manufactured above an active layer to reduce a leakage current generated when the active layer is exposed to light and enhance the display quality. Besides, the light shielding layer is of a photoresist material, a photoresist layer is adopted as a mask in a process of preparing the active layer. After the preparation of the active layer is completed, the reserved photoresist layer may be used as the light shielding layer covering the active layer. The shielding layer and the active layer are manufactured through the patterning process, which eliminates the need to add patterning processes, simplifies the technological process, and improves production efficiency.

It should be noted that the above is only the preferred embodiment of the present disclosure and principles of the adopted techniques. It will be understood by those skilled in the art that the present disclosure is not limited to the specific embodiments described herein and that various changes, re-modifications and substitutions will occur to those skilled in the art without departing from the protection scope of the present disclosure. Accordingly, although the present disclosure has been described in detail by way of the above embodiments, the present disclosure is not merely limited to the above embodiments, and other equivalent embodiments may be included without departing from the conception of the present disclosure. The scope of the present disclosure is defined by the appended claims.

What is claimed is:

1. A method for manufacturing a thin film transistor, comprising:
   providing a substrate;
   forming an active layer and a light shielding layer covering the active layer on the substrate by a patterning process, the light shielding layer being formed of a photoresist material, wherein the step of forming an active layer and a light shielding layer covering the active layer on the substrate by a patterning process further comprises:
      depositing the active layer on the substrate;
      coating a photoresist layer on the active layer; and
      etching the active layer by using the photoresist layer as a mask, to obtain an active layer and the light shielding layer covering the active layer; and
   forming a source-drain electrode layer and a passivation layer covering the source-drain electrode layer.

2. The method for manufacturing a thin film transistor according to claim 1, wherein the step of etching the active layer by using the photoresist layer as a mask, to obtain an active layer and the light shielding layer covering the active layer comprises:
   exposing the photoresist layer by using a mask plate, in this way that the photoresist layer forms an unexposed region, a partially exposed region, and a fully exposed region;
   performing developing treatment to the photoresist layer, in this way that the photoresist layer forms a completely reserved region corresponding to the unexposed region, a partially reserved region corresponding to the partially exposed region, and a completely removed region corresponding to the fully exposed region;
   etching the active layer corresponding to the fully exposed region by using an etching process; and
   performing ashing treatment to the photoresist, in this way that the completely reserved region of the photoresist layer forms the light shielding layer.

3. The method for manufacturing a thin film transistor according to claim 1, wherein the photoresist material is a material having a photosensitive property, and a thickness of the light shielding layer is 400 nm.

4. The method for manufacturing a thin film transistor according to claim 1, wherein the photoresist material is a material having a photosensitive property, and a thickness of the light shielding layer is 400 nm.

5. The method for manufacturing a thin film transistor according to claim 2, wherein the photoresist material is a material having a photosensitive property, and a thickness of the light shielding layer is 400 nm.

6. A thin film transistor, comprising:
   a substrate;
   an active layer, formed on the substrate; and
   a light shielding layer, formed on the active layer away from the substrate and covering the active layer,
   wherein the light shielding layer is composed of a photoresist material; and
   wherein the active layer and the light shielding layer are formed by a patterning process, and the light shielding layer is served as a mask for forming the active layer.

7. The thin film transistor of claim 6, further comprises:
   a gate line, formed on the substrate;
   an insulating layer, formed on the gate line away from the substrate, wherein the active layer is formed on the insulating layer away from the substrate;
   a source-drain electrode layer and a passivation layer, formed on the light shielding layer away from the substrate; and
   a pixel electrode layer, formed on a region of the substrate away from the gate line.

8. The thin film transistor according to claim 6, wherein the photoresist material is a material having a photosensitive property, and a thickness of the light shielding layer is 400 nm.

9. The thin film transistor according to claim 6, wherein the photoresist material is a material having a photosensitive property, and a thickness of the light shielding layer is 400 nm.

10. The thin film transistor according to claim 7, wherein the photoresist material is a positive photoresist material or a negative photoresist material having a photosensitive property, and a thickness of the light shielding layer is 400 nm.

11. An array substrate, comprising the thin film transistor according to claim 6.

12. The array substrate according to claim 11, wherein the active layer and the light shielding layer are formed by a patterning process, and the light shielding layer is served as a mask for forming the active layer.

13. The array substrate according to claim 12, wherein the thin film transistor further comprises:
   a gate line, formed on the substrate;
   an insulating layer, formed on the gate line away from the substrate, wherein the active layer is formed on the insulating layer away from the substrate;
   a source-drain electrode layer and a passivation layer, formed on the light shielding layer away from the substrate; and
   a pixel electrode layer, formed on a region of the substrate away from the gate line.

14. The array substrate according to claim 11, wherein the photoresist material is a material having a photosensitive property, and a thickness of the light shielding layer is 400 nm.

15. A display device, comprising the array substrate according to claim 11.

16. The display device according to claim 15, wherein the active layer and the light shielding layer are formed by a patterning process, and the light shielding layer is served as a mask for forming the active layer.

17. The display device according to claim 16, wherein the thin film transistor further comprises:
- a gate line, formed on the substrate;
- an insulating layer, formed on the gate line away from the substrate, wherein the active layer is formed on the insulating layer away from the substrate;
- a source-drain electrode layer and a passivation layer, formed on the light shielding layer away from the substrate; and
- a pixel electrode layer, formed on a region of the substrate away from the gate line.

18. The display device according to claim 15, wherein the photoresist material is a material having a photosensitive property, and a thickness of the light shielding layer is 400 nm.

\* \* \* \* \*